United States Patent
Ciocarlie et al.

(10) Patent No.: US 10,663,361 B2
(45) Date of Patent: May 26, 2020

(54) SYSTEMS AND METHODS FOR TACTILE SENSING

(71) Applicant: THE TRUSTEES OF COLUMBIA UNIVERSITY IN THE CITY OF NEW YORK, New York, NY (US)

(72) Inventors: Matei Ciocarlie, New York, NY (US); Pedro Piacenza, New York, NY (US); Ioannis Kymissis, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 0 days.

(21) Appl. No.: 15/782,303

(22) Filed: Oct. 12, 2017

(65) Prior Publication Data
US 2018/0106692 A1 Apr. 19, 2018

Related U.S. Application Data

(60) Provisional application No. 62/440,002, filed on Dec. 29, 2016, provisional application No. 62/407,788, filed on Oct. 13, 2016.

(51) Int. Cl.
*G01L 1/24* (2006.01)
*G06F 3/042* (2006.01)
(Continued)

(52) U.S. Cl.
CPC .............. *G01L 1/247* (2013.01); *G01L 5/166* (2013.01); *G01L 9/0076* (2013.01); *G06F 3/042* (2013.01);
(Continued)

(58) Field of Classification Search
CPC . G01L 1/24; G01L 1/247; G01L 9/076–0076; G01L 5/166;
(Continued)

(56) References Cited

U.S. PATENT DOCUMENTS 4,484,179 A * 11/1984 Kasday .................. G01L 1/247
178/18.01
5,225,959 A 7/1993 Stearns
(Continued)

FOREIGN PATENT DOCUMENTS

| EP | 3076402 A1 | 10/2016 | |
|---|---|---|---|
| WO | WO-2016125905 A1 * | 8/2016 | ............. C08G 18/65 |
| WO | WO-2016153155 A1 | 9/2016 | |

OTHER PUBLICATIONS

Alamusi et al., "Piezoresistive Strain Sensors Made from Carbon Nanotubes Based Polymer Nanocomposites," Sensors, vol. 11, pp. 10691-10723 (2011).
(Continued)

*Primary Examiner* — Zandra V Smith
*Assistant Examiner* — Jeremy J Joy
(74) *Attorney, Agent, or Firm* — Wilmer Cutler Pickering Hale and Dorr LLP

(57) ABSTRACT

Achieving high spatial resolution in contact sensing for robotic manipulation often comes at the price of increased complexity in fabrication and integration. One traditional approach is to fabricate a large number of taxels, each delivering an individual, isolated response to a stimulus. The proposed sensors include a continuous volume of soft material, e.g., a transparent polymer, and light emitting diodes configured to emit light into the transparent volume that can be received by photodetectors. The location and depth of indentations can be measured between all pairs of light emitting diodes and photodetectors in the set, and this rich signal set can contain the information needed to pinpoint contact location with high accuracy using regression algorithms.

14 Claims, 16 Drawing Sheets

(51) Int. Cl.
  *G01L 5/16* (2006.01)
  *H01L 27/146* (2006.01)
  *H01L 31/18* (2006.01)
  *H01L 31/14* (2006.01)
  *G01L 9/00* (2006.01)
  *G01L 5/166* (2020.01)

(52) U.S. Cl.
  CPC .... *H01L 27/1469* (2013.01); *H01L 27/14643* (2013.01); *H01L 31/14* (2013.01); *H01L 31/18* (2013.01)

(58) Field of Classification Search
  CPC ........... G06F 3/042–0428; H01L 31/14; H01L 27/1469; H01L 27/14643; B25J 13/084; A61B 2562/0233
  See application file for complete search history.

(56) References Cited

U.S. PATENT DOCUMENTS

| | | | |
|---|---|---|---|
| 5,760,530 | A | 6/1998 | Kolesar |
| 7,658,119 | B2 | 2/2010 | Loeb et al. |
| 8,127,623 | B2 | 3/2012 | Son et al. |
| 8,436,833 | B2* | 5/2013 | King ...................... G06F 3/0421 345/175 |
| 8,991,251 | B1 | 3/2015 | Emley |
| 9,052,775 | B1* | 6/2015 | Salisbury ................ G01L 5/226 |
| 9,141,232 | B2* | 9/2015 | Hong ..................... G06F 3/0436 |
| 9,239,346 | B2 | 1/2016 | Santos et al. |
| 9,354,703 | B2 | 5/2016 | Maggiali et al. |
| 9,874,978 | B2* | 1/2018 | Wall ....................... G06F 1/3262 |
| 10,228,799 | B2* | 3/2019 | Chen ....................... G06F 3/044 |
| 2008/0029691 | A1* | 2/2008 | Han .................... G06F 3/04883 250/224 |
| 2008/0150913 | A1* | 6/2008 | Bell ........................ G06F 3/011 345/175 |
| 2008/0284925 | A1* | 11/2008 | Han ....................... G06F 3/0425 349/12 |
| 2009/0033637 | A1* | 2/2009 | Han ....................... G06F 3/0421 345/175 |
| 2009/0128499 | A1* | 5/2009 | Izadi ...................... G06F 3/0425 345/173 |
| 2009/0315989 | A1* | 12/2009 | Adelson ................ A61B 5/1172 348/135 |
| 2010/0253650 | A1* | 10/2010 | Dietzel ................... G01L 1/241 345/175 |
| 2011/0123100 | A1 | 5/2011 | Carroll et al. |
| 2012/0240691 | A1* | 9/2012 | Wettels ..................... G01L 1/24 73/862.624 |
| 2012/0312102 | A1 | 12/2012 | Alvarez et al. |
| 2013/0031987 | A1 | 2/2013 | Beauvais et al. |
| 2013/0070074 | A1* | 3/2013 | Won ........................ G01L 1/247 348/77 |
| 2013/0285977 | A1* | 10/2013 | Baharav ................. G06F 3/0414 345/174 |
| 2014/0124737 | A1 | 5/2014 | Takei et al. |
| 2015/0242057 | A1* | 8/2015 | Galela ................... G06F 3/0428 345/175 |
| 2016/0011063 | A1 | 1/2016 | Zhang et al. |
| 2016/0033343 | A1 | 2/2016 | Park et al. |
| 2016/0164433 | A1 | 6/2016 | Won et al. |
| 2016/0266616 | A1 | 9/2016 | Chang et al. |
| 2016/0310261 | A1 | 10/2016 | Hekmatshoartabari et al. |
| 2017/0270342 | A1* | 9/2017 | He ......................... G06F 3/0412 |
| 2018/0022861 | A1* | 1/2018 | Mitsuzuka ............. C08G 18/65 73/705 |
| 2018/0188125 | A1* | 7/2018 | Park ......................... G01L 1/24 |

OTHER PUBLICATIONS

Alirezaei et al., "A tactile distribution sensor which enables stable measurement under high and dynamic stretch," 2009 IEEE Symposium on 3D User Interfaces, pp. 87-93 (2009).

Argall and Billard, "Learning from demonstration and correction via multiple modalities for a humanoid robot," Proceedings of the International Conference SKILLS, pp. 1-4 (2011).

Begej, "Planar and finger-shaped optical tactile sensors for robotic applications," IEEE Journal of Robotics and Automation, vol. 4, No. 5, pp. 472-484 (1988).

Bekiroglu et al., "Assessing grasp stability based on learning and haptic data," IEEE Transactions on Robotics, vol. 27, No. 3, pp. 616-629, 14 pages (2011).

Cannata et al., "Towards automated self-calibration of robot skin," 2010 IEEE International Conference on Robotics and Automation (ICRA), pp. 4849-4854 (2010).

Dahiya et al., "Tactile Sensing-From Humans to Humanoids," IEEE Transactions on Robotics, vol. 26, No. 1, pp. 1-20 (2009).

Dang and Allen, "Grasp adjustment on novel objects using tactile experience from similar local geometry," IEEE/RSJ International Conference on Intelligent Robots and Systems (IROS), pp. 4007-4012, 6 pages (2013).

Hammock et al., "25th Anniversary Article: The Evolution of Electronic Skin (E-Skin): A Brief History, Design Considerations, and Recent Progress," Advanced Materials, vol. 25, pp. 1-41, 41 pages (2013).

Johnson and Adelson, "Retrographic sensing for the measurement of surface texture and shape," Computer Vision and Pattern Recognition (CVPR), pp. 1070-1077, 8 pages (2009).

Kato et al., "Tactile sensor without wire and sensing element in the tactile region based on EIT method," IEEE SENSORS 2007 Conference, pp. 792-795 (2007).

Lepora and Ward-Cherrier, "Superresolution with an optical tactile sensor," IEEE/RSJ International Conference on Intelligent Robots and Systems (IROS), pp. 2686-2691, 6 pages (Sep. 2015).

Lepora et al., "Tactile superresolution and biomimetic hyperacuity," IEEE Transactions on Robotics, vol. 31, No. 3, pp. 605-618, 14 pages (2015).

Muscari et al., "Real-time reconstruction of contact shapes for large area robot skin," 2013 IEEE International Conference on Robotics and Automation (ICRA), pp. 2360-2366, 7 pages, (2013).

Nagakubo et al., "A deformable and deformation sensitive tactile distribution sensor," 2007 IEEE International Conference on Robotics and Biomimetics (ROBIO 2007), pp. 1301-1308, 8 pages (2007).

Patel and Correll, "Integrated force and distance sensing using elastomer-embedded commodity proximity sensors," Proceedings of Robotics: Science and Systems, 10 pages (2016).

Piacenza et al., "Contact localization through spatially overlapping piezoresistive signals," IEEE/RSJ Intl. Conf. on Intelligent Robots and Systems, pp. 195-201, 6 pages (2016).

Polygerinos et al., "MRI-compatible fiber-optic force sensors for catheterization procedures," IEEE Sensors Journal, vol. 10, No. 10, pp. 1598-1608, 11 pages (2010).

Ponce Wong et al., "Haptic exploration of fingertip-sized geometric features using a multimodal tactile sensor," Proc. SPIE Defense, Security and Sensing/Sensing Technology and Applications Sensors for Next-Generation Robotics Conference, vol. 9116, pp. 911605-1-911605-15, 15 pages (2014).

Saal et al., "Active estimation of object dynamics parameters with tactile sensors," 2010 IEEE/RSJ International Conference on Intelligent Robots and Systems (IROS), 6 pages (2010).

Schneider et al., "Process and material properties of polydimethylsiloxane (PDMS) for optical MEMS," Sensors and Actuators A: Physical, vol. 151, No. 2, pp. 95-99 (2009).

Tanaka et al., "Object manifold learning with action features for active tactile object recognition," 2014 IEEE/RSJ International Conference on Intelligent Robots and Systems (IROS 2014), pp. 608-614, 7 pages (2014).

Tawil et al., "Touch modality interpretation for an EIT-based sensitive skin," 2011 IEEE International Conference on Robotics and Automation (ICRA), pp. 3770-3776, 7 pages (2011).

Tenzer et al., "The feel of MEMS barometers: Inexpensive and easily customized tactile array sensors," IEEE Robotics & Automation Magazine, vol. 21, No. 3, pp. 89-95, 7 pages (2014).

(56) References Cited

OTHER PUBLICATIONS

Van den Heever et al., "Tactile sensing using force sensing resistors and a super-resolution algorithm," IEEE Sensors Journal, vol. 9, No. 1, pp. 29-35, 7 pages (Jan. 2009).
Wan et al., "Variability and predictability in tactile sensing during grasping," IEEE International Conference on Robotics and Automation, 7 pages (2016).
Wettels et al., "Biomimetic tactile sensor array," Adv. Robot., vol. 22, No. 8, pp. 829-849, 21 pages (2008).
Yousef et al., "Tactile sensing for dexterous in-hand manipulation in robotics: A review," Sensors and Actuators A: Physical, vol. 167, No. 2, pp. 171-187, 17 pages (2011).
Alfadhel, et al., "A magnetic nanocomposite for biomimetic flow sensing", Lab on a Chip, 14(22):4362-4369, Aug. 29, 2014 (8 pages).
Billard, et al. "The Roboskin Project: Challenges and Results", Romansy 19—Robot Design, Dynamics and Control, Proceedings of the 19th CISM-International Centre for Mechanical Sciences, vol. 544, pp. 351-358, 2013 (8 pages).
Buscher, et al., "Flexible and Stretchable Fabric-Based Tactile Sensor", Robotics and Autonomous Systems, 63(3):244-252, Jan. 2015, available online Sep. 16, 2014 (9 pages).
Dahiya, et al., "Directions Toward Effective Utilization of Tactile Skin: A Review", IEEE Sensors Journal, 13(11):4121-4138, Nov. 2013 (18 pages).
Drimus, et al., "High Resolution Tactile Sensors for Curved Robotic Fingertips", in Biomimetic & Biohybrid Systems: Living Machines, Duff, et al., (eds.), pp. 383-385, 2014 (3 pages).
El-Molla, et al., "Integration of a Thin Film PDMS-Based Capacitive Sensor for Tactile Sensing in an Electronic Skin", Journal of Sensors, 2016:1-7, Feb. 23, 2016 (7 pages).
George, "A Step Closer to Humans—Artificial Skin for Robots", Smashing Robotics, May 17, 2014, httos://www.smashinarobotics.comia-sten-closer-to-humans-artificial-skin-for-robots/, accessed Dec. 11, 2019 (9 pages).
Ji, et al., "A Flexible Capacitive Tactile Sensor for Robot Skin", 2016 International Conference on Advanced Robotics and Mechatronics (ICARM) Proceedings pp. 207-212, Aug. 2016 (6 pages).
Kawasaki, "Chapter 1: The Human Hand and the Robotic Hand", in Robot Hands and Multi-Fingered Haptic Interfaces, World Scientific, accessed Dec. 11, 2019, pp. 1-27, 2015 (27 pages).
Maiolo, et al., "Flexible sensing systems based on polysilicon thin film transistors technology", Sensors and Actuators B: Chemical, 179:114-124, available online Oct. 31, 2012 (11 pages).
Maiolino, et al., "A Flexible and Robust Large Scale Capacitive Tactile System for Robots", IEEE Sensors Journal 13(10):3910-3917, Oct. 2013 (8 pages).
Mannsfeld, et al., "Highly sensitive flexible pressure sensors with microstructured rubber dielectric layers", Nature Materials, 9:859-864, published online Sep. 12, 2010 (6 pages).
NRI: Robust and Low-Cost Smart Skin with Active Sensing Network for Enhancing Human-Robot Interaction, National Science Foundation, Award Number: 1528145, Oct. 1, 2015-Jun. 30, 2020, https://nsf.gov/awardsearch/show/Award?AWD_ID=15281458HistoricalAwards=false, accessed Dec. 11, 2019 (2 pages).
Park, "Soft artificial skin sensors", Soft Robotics & Bionics Lab, http://softrobotics.cs.cmu.edu/research.html, 2014, (2 pages).
Park, et al., "Tactile-Direction-Sensitive and Stretchable Electronic Skins Based on Human-Skin-Inspired Interlocked Microstructures", ACS Nano, 8(12):12020-12029, Nov. 12, 2014 (10 pages).
Roboskin: Skin-Based Technologies and Capabilities for \nSafe, Autonomous and Interactive Robots, ICT Grant #: FP7-ICT 231500, May 1, 2009-Apr. 30, 2012 (4 pages).
Rothmaier, et al., "Textile Pressure Sensor Made of Flexible Plastic Optical Fibers", Sensors, 8(7):4318-4329, Jul. 25, 2008 (12 pages).
Tee, et al., "A skin-inspired organic digital mechanoreceptor", Science, 350(6258):313-316, Oct. 16, 2015 (5 pages).
Wang, et al., "User-interactive electronic skin for instantaneous pressure visualization", Nature Materials 12:899-904, published online Jul. 21, 2013 (6 pages).
Wisitsoraat, et al., "Low cost thin film based piezoresistive MEMS tactile sensors", Sensors and Actuators A, 139(1-2):17-22, Sep. 2007, available online Nov. 16, 2006 (6 pages).

* cited by examiner

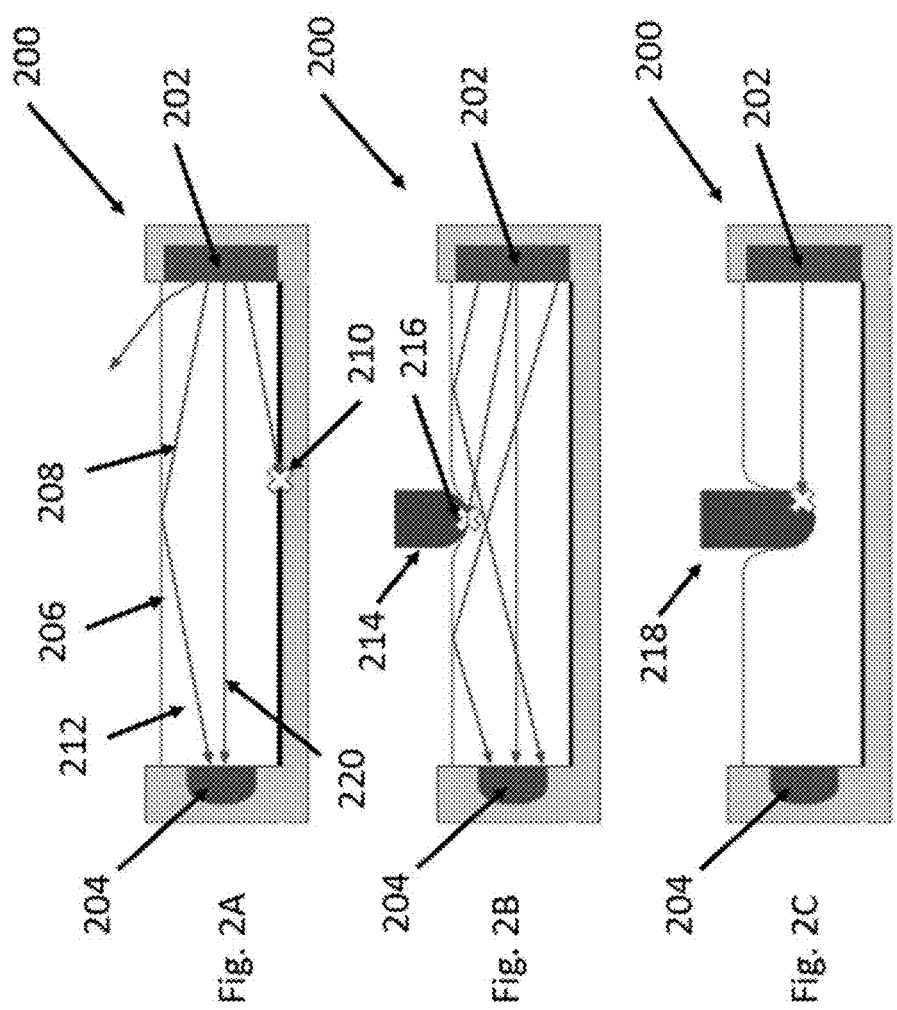

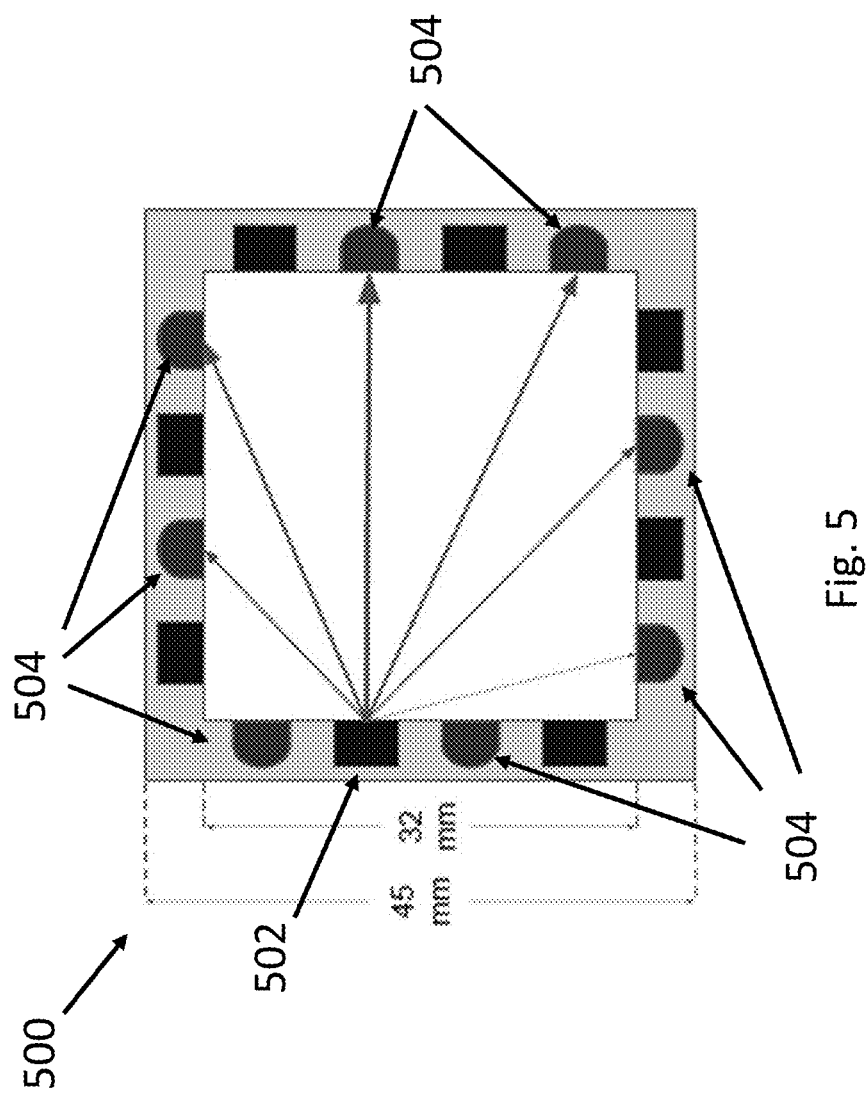

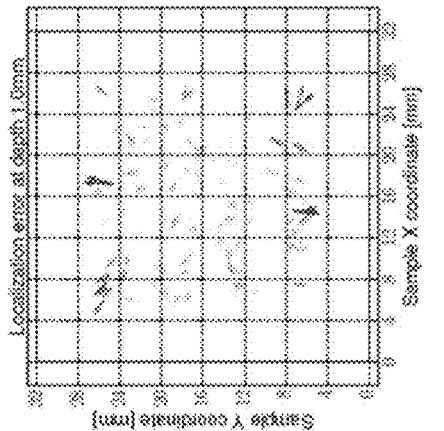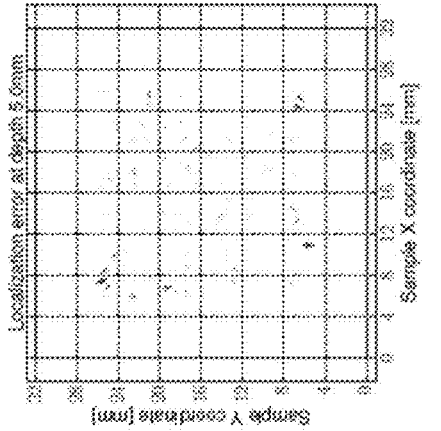
Fig. 7C                    Fig. 7F
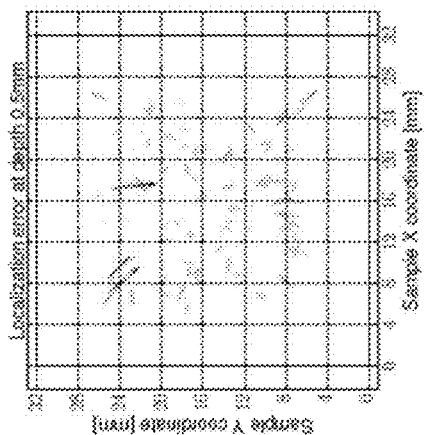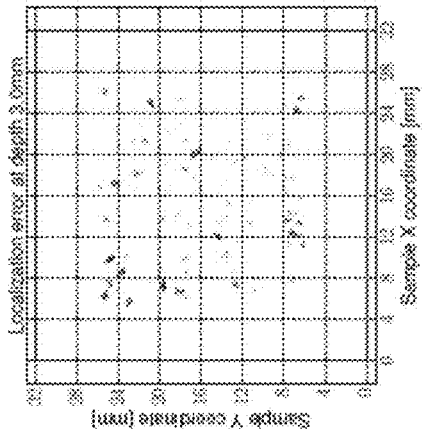
Fig. 7B                    Fig. 7E
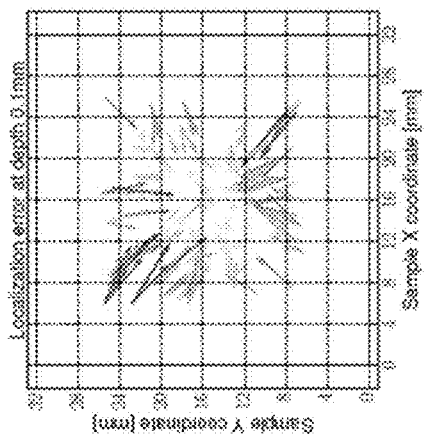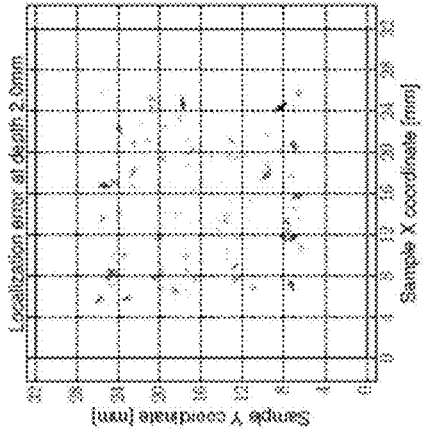
Fig. 7A                    Fig. 7D

1400

SYSTEMS AND METHODS FOR TACTILE SENSING

CROSS-REFERENCE TO RELATED APPLICATIONS

This application claims priority under 35 U.S.C. § 119(e) to U.S. Provisional Patent Application No. 62/440,002 filed on Dec. 29, 2016, entitled "Use of Compliant Layer to Change Responsivity of Tactile Sensors," and to U.S. Provisional Patent Application No. 62/407,788 filed on Oct. 13, 2016, entitled "Optics-based Tactile Sensor," wherein the contents of both applications are hereby incorporated in their entirety by reference.

This application is also related to U.S. patent application Ser. No. 15/474,080 filed on Mar. 30, 2017, entitled "Systems and Methods for Contact Localization Through Spatially Overlapping Piezoresistive Signals" which claims priority to U.S. Provisional Patent Application No. 62/316,260 filed on Mar. 31, 2016, and entitled "Contact Localization Through Spatially Overlapping Piezoresistive Signals," wherein the contents of both applications are hereby incorporated in their entirety by reference.

FIELD OF THE INVENTION

This invention relates to methods and systems for tactile sensing, and particularly, to methods and systems for optics-based tactile sensing and to methods and systems using a compliant layer to change the responsivity of tactile sensors.

BACKGROUND

Traditional methods to achieve high localization accuracy with tactile sensors usually employ a matrix of miniaturized individual sensors distributed on the area or surface of interest. This approach usually comes at a price of increased complexity in fabrication and circuitry, and can be hard to adapt for non-planar geometries. Despite recent advances, prior art methods for robotic manipulation have yet to provide robotic hands with increased sensitivity and abilities. Stand-alone tactile sensing demonstrated in testing conditions, e.g., individual tactile element ("taxel") testing on a workbench or laboratory, is not easily transferable to useful tactile-sensing integrated within a robotic hand. For example, even though tactile sensing arrays are designed to be flexible, conformable, and stretchable, other constraints, such as wiring, power consumption, robustness, manufacturability, and maintainability, make them cumbersome to use in a robotic hand, and especially difficult to integrate inside a robot finger. Inside a robotic hand, the sensor needs to be small, with very strict shape and packaging requirements, and needs to work over long periods of time in not perfectly controlled environments.

Accordingly, new and improved interfaces and/or interactions are desirable to achieve high-resolution sensing over relatively large areas of a robotic surface using sensors that can be amenable to integration inside a robot hand.

SUMMARY

According to aspects of the disclosure systems and methods for tactile sensing are provided. A sensor can include a volume of transparent material, one or more light emitting diodes configured to emit light into the transparent material, and one or more photodetectors configured to receive emitted light from the one or more light emitting diodes. According to aspects of the disclosure, the sensor can be configured to detect a change in the received light at the one or more photodetectors in response to an indentation at a surface of the volume of transparent material.

According to aspects of the disclosure, the sensor can estimate a location of the indentation at the surface of the volume of transparent material based on the change in the received light at the one or more photodetectors, and can also estimate a depth of the indentation at the surface of the volume of transparent material based on the change in the received light at the one or more photodetectors.

According to aspects of the disclosure, the volume of transparent material comprises polydimethylsiloxane (PDMS). The sensor can also include a frame defining a sensing area filled with the volume of transparent material, and can have the one or more light emitting diodes and the one or more photodetectors mounted on the frame around the sensing area. The sensor can also include a light absorbing surface between a first surface of the volume of transparent material and a first surface of the frame. According to aspects of the disclosure, the first surface of the frame can be curved and at least one light emitting diode is mounted on the first surface of the frame.

The sensor can also include a light reflective surface where light from the one or more light emitting diodes is reflected back into the volume of transparent material, when the light from the one or more light emitting diodes hits the light reflective surface at a first angle. The sensor can also be configured to receive first light from at least one light emitting diode through a direct path and to receive second light from the at least one light emitting diode thought an indirect path, where the second light has been reflected at the light reflective surface.

According to aspects of the disclosure, the sensor can operate at a first mode of detection when the depth of the indentation is smaller than a first threshold, and at a second mode of detection when the depth of the indentation is larger than a second threshold.

According to aspects of the disclosure, a method for tactile sensing can include the steps of providing a volume of transparent material, configuring one or more light emitting diodes to emit light into the transparent material, configuring one or more photodetectors to receive emitted light from the one or more light emitting diodes, and detecting a change in the received light at the one or more photodetectors in response to an indentation at a surface of the volume of transparent material.

According to aspects of the disclosure, the method can also include the steps of estimating a location of the indentation at the surface of the volume of transparent material based on the change in the received light at the one or more photodetectors, and estimating a depth of the indentation at the surface of the volume of transparent material based on the change in the received light at the one or more photodetectors.

According to aspects of the disclosure, the method can also include the steps of defining a sensing area filled with the volume of transparent material, and mounting the one or more light emitting diodes and the one or more photodetectors on the frame around the sensing area. According to aspects of the disclosure, the method can also include the steps of providing a light absorbing surface between a first surface of the volume of transparent material and a first surface of the frame. According to aspects of the disclosure, the method can also include the step of providing a light reflective surface where light from the one or more light emitting diodes is reflected back into the volume of transparent material, when the light from the one or more light emitting diodes hits the light reflective surface at a first angle.

According to aspects of the disclosure, the method can also include the step of configuring at least one photodetector to receive first light from at least one light emitting diode through a direct path and to receive second light from the at least one light emitting diode thought an indirect path, where the second light has been reflected at the light reflective surface.

According to aspects of the disclosure, the method can also include the steps of operating the sensor at a first mode of detection when the depth of the indentation is smaller than a first threshold, and operating the sensor at a second mode of detection when the depth of the indentation is larger than a second threshold.

BRIEF DESCRIPTION OF THE DRAWINGS

Various objects, features, and advantages of the present invention can be more fully appreciated with reference to the following detailed description of the invention when considered in connection with the following drawing, in which like reference numerals identify like elements. The following drawings are for illustration purposes only and are not intended to be limiting of the invention, the scope of which is set forth in the claims that follow.

FIGS. 2A-2C illustrate exemplary modes of operation of a tactile sensor, according to aspects of the disclosure.

FIG. 5 illustrates an exemplary tactile sensor design, according to aspects of the disclosure.

FIGS. 7A-7F illustrate exemplary localization errors for different indentation depths.

DETAILED DESCRIPTION

Tactile sensors for robot manipulators can be analyzed and quantified based on multiple performance criteria. From an operational perspective, these performance criteria can include high accuracy in establishing both the location of a contact and the magnitude of the forces applied to the tactile sensors. For example, good signal-to-noise ratio is desirable for both the contact forces that characterize incipient contact and the larger forces encountered during manipulation. From a manufacturing perspective, a performance criteria can include achieving coverage of potentially irregular, non-flat surfaces, e.g., for application to robotic fingers and palms.

Prior art techniques attempt to achieve accuracy and good coverage by using individual taxels distributed over the surface that must be sensorized. However, distributing individual taxels over the surface, which results in a taxel array, imposes miniaturization constraints on each taxel. Matrix addressing for taxel arrays reduces the complexity of the circuit and allows part of it to be implemented on a printed circuit board, but imposes a two-dimensional structure on the sensor. Achieving multiple such performance metrics traditionally leads to manufacturing difficulties and system constraints that prohibit large-scale deployment.

According to aspects of the disclosure, systems and methods are provided for tactile sensing using optic components that can be mounted, on the edges of the sensing area to measure how light traveling through an elastomer is affected by touch. Exemplary implementations of optics-based tactile sensors can use multiple light emitters and receivers to provide a rich signal set that can contain information for identifying the location and depth of an indentation with high accuracy. For example, the proposed methods and systems demonstrate sub-millimeter accuracy on location and depth on a 20 mm-by-20 mm active sensing area. According to aspects of the disclosure, the disclosed sensor can provide high depth sensitivity as a result of two different modalities in how light is guided through the elastomer. The proposed methods and systems result in a low cost sensor that is easy to manufacture. According to aspects of the disclosure, the proposed systems and methods can provide tactile sensing for non-planar surfaces, enabling integration in robot skin applications.

Figure 1:
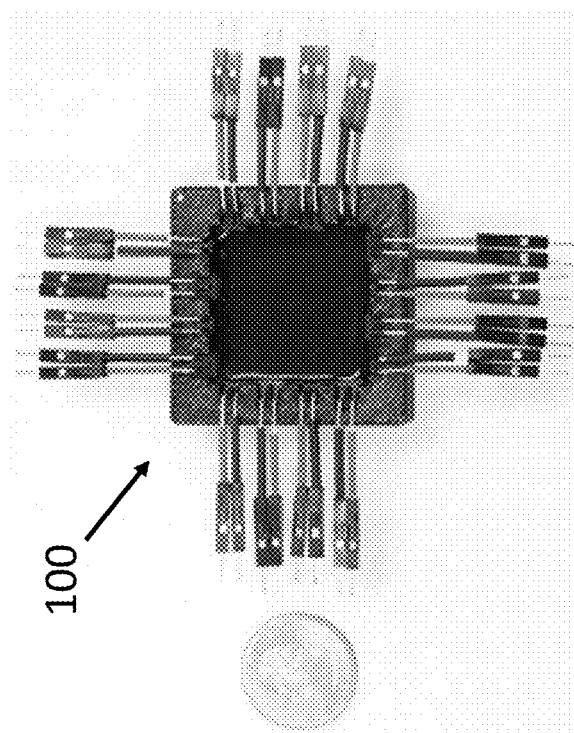
FIG. 1 illustrates an exemplary tactile sensor, according to aspects of the disclosure.

FIG. 1 shows an exemplary tactile sensor 100 according to aspects of the disclosure. Tactile sensor 100 includes a continuous volume of a transparent polymer, e.g., square mold, where light emitters, e.g., light-emitting diodes (LEDs), and receivers, e.g., photodiodes, can be embedded, e.g., edge-mounted, into the volume, e.g., along the perimeter, of the transparent polymer. According to aspects of the disclosure, measuring how the light is guided through the transparent polymer, provides information about the location and depth of an indentation on the volume of the transparent polymer. Indentation of the sensor area affects how light from the emitters is transported through this medium, producing a signal that is measured by the receivers. The proposed methods and systems use indentation depth as a proxy for contact force, based, for example, on a known stiffness curve for the constituent material. Because the transparent polymer can be an elastomer, the disclosed tactile sensors can be employed to cover large areas that have curved surfaces, e.g., the continuous volume of the elastomer can cover large non-planar areas.

According to aspects of the disclosure, the disclosed tactile sensors can achieve high accuracy in both localization and indentation depth prediction, by leveraging multiple modes of interaction between an indenting probe and a light-transporting medium and by using data-driven methods to learn the mapping between data from the sensor and the variables of interest, e.g., localization and indentation depth.

Using multiple modes of interaction between an indenting probe and a light-transporting medium can increase depth prediction accuracy throughout the operating range. Indentation of the medium, for example, by probing the medium using a finger, affects light transport through the medium at least two ways. First, during initial contact, the probe alters the geometry of the surface, which changes the refraction of the light. This can correspond to a first mode of interaction with the sensor. Second, as the indentation becomes deeper, e.g., by probing the medium harder, the probe blocks direct paths between emitters and receivers. This can correspond to a second mode of interaction with the sensor. The disclosed sensors can use both modes in continuous fashion, resulting in a good sensitivity throughout a wide range of indentation depths.

The disclosed methods for tactile sensing can utilize data-driven methods to learn a mapping between a signal set extracted from the tactile sensor and variables of interest. For example, the signal set can be obtained by measuring the signal between every emitter and every receiver, for example, a sensor with eight emitters and eight receivers has sixty four different pairs of emitters-receivers. Utilizing information from all pairs can provide high localization accuracy on a piezoresistance-based sensor. The proposed methods and systems show that with optics as the underlying transduction mechanism, the indentation depth can be identified, and also unwanted phenomena such as drift and hysteresis can be reduced.

The disclosed tactile sensors exhibit desirable performance characteristics in accuracy and sensitivity, while using a simple a manufacturing method and low-cost components. Both the fabrication technique and the data-driven signal processing approach can also lend themselves to constructing sensors of irregular three-dimensional geometry. Furthermore, mapping the signal between every emitter and receiver pair can produce a rich signal set with relatively few wires. Both of these characteristics could enable easier integration of such sensors into robotic fingers and palms, which is an aspect of the disclosure.

Light Transport and Interaction Modes

FIG. 2A shows an exemplary sensor 200 that includes a light emitting diode (LED) 202, a photodiode receiver 204 edge-mounted, e.g., on a frame, around a sensing area which is filled with a transparent elastomer 212, for example, a flexible low-durometer material such as polydimethylsiloxane (PDMS). Sensor 200 has a light reflective surface 206, where the light can reflect if it hits the surface at an appropriate angle, and an absorbing surface 210, where light does not reflect. In this state, the photodiode receives the maximum amount of light from the LED. A person of skill in the art would understand that the disclosed systems and methods can use sensors comprising multiple emitters and receivers. The single emitter-receiver pair of FIG. 2A is discussed to explain the underlying transduction mechanism.

According to embodiments, a probe indents the surface of the sample, light transport between the emitter and the receiver is altered, changing the signal reported by the receiver. Light from the LED can reach the opposite photodiode through multiple paths, e.g., through a direct path (220) or through a reflection (208). Based on Snell's law, due to different refractive indices of the elastomer and air, light rays (208) hitting the surface below the critical angle are reflected back into the sample.

As the probe makes initial contact with the sample surface (214), as shown in FIG. 2B, the elastomer-air interface is removed from the area of contact 216; furthermore, the reflective surface 206 is disturbed. The probe decreases the amount of light that can reach the diode via surface reflection, because light that hits the area of contact 216 is not reflected towards the receiver. The change in the amount of light received at the receiver can be detected by the disclosed methods and systems. According to aspects of the disclosure, this can correspond to a first mode of interaction. The tactile sensor is highly sensitive to the initial contact, where little penetration depth can produce a strong output signal.

As the depth of indentation increases (218), as shown in FIG. 2C, the object penetration into the PDMS can block the light rays that were reaching the photodiode through a direct, line-of-sight path, e.g., light 220 shown in FIG. 2A. According to aspects of the disclosure, when the penetration blocks a direct path of light from the diode to the receiver, this can correspond to a second mode of interaction. The change in the amount of light received at the receiver can be detected by the disclosed methods and systems, for example, when the probe reaches deep enough under the surface, where it can block a significant part of the receiver's surface from the LED's vantage point.

Other light paths are also possible between the emitter and receiver. In particular, the interface between the clear elastomer and the holding structure (the bottom and side walls of the sample) can also give rise to reflections. In practice however, the transparent elastomer and the holding plastic can exhibit bonding/unbonding effects when indented. These effects can happen at a time scale of 5-10 s, significantly larger than the indentations, and thus can create unwanted hysteresis, and produce unreliable detections. To eliminate such effects, the bottom side of the transparent elastomer can be coated with a thin layer, e.g., 1 mm, of elastomer saturated with carbon black particles, as shown in FIG. 2A. This can eliminate bottom surface reflections, and can exhibit no adverse effects, as the clear elastomer can naturally and permanently bond with the carbon black-filled layer. The coating at the bottom side of the transparent elastomer does not prevent reflections of the walls of the sensor. These reflections are possible and can produce meaningful signals that are used by data-driven mapping algorithm, described below.

Effective Operating Range and Prototype Construction

The disclosed systems and methods can take advantage of the two operating modes described above, where the first mode is sensitive to small indentations while the second provides a strong response to deeper probes. According to aspects of the disclosure, the two modes are contiguous as the indentation depth increases. This can result in high sensitivity throughout the operating range of the sensor. A geometric factor that can affect this behavior is the height of the transparent elastomer. The height of the transparent elastomer can be determined experimentally or with analytical methods.

Figure 3B:
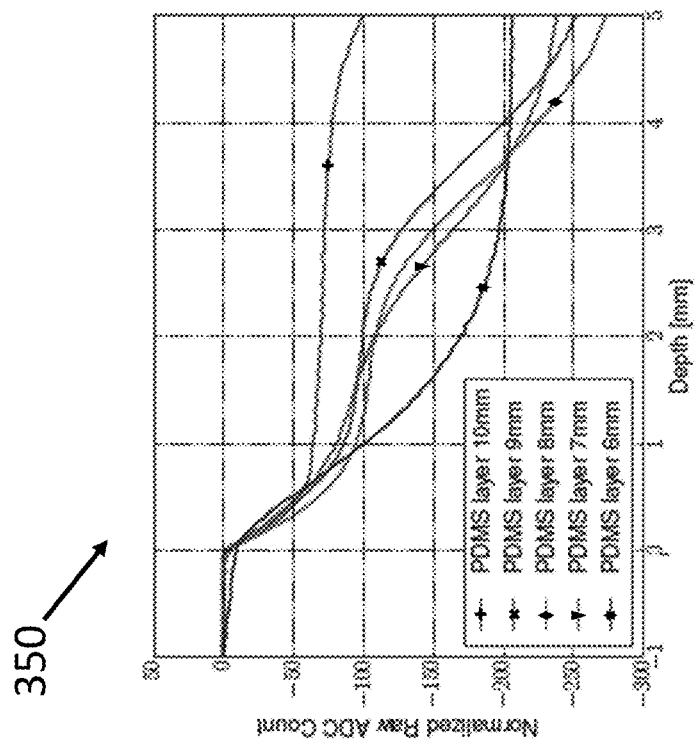
FIGS. 3A-3B illustrate exemplary signal measurements for different tactile sensor indentations, according to aspects of the disclosure.
Figure 3A:
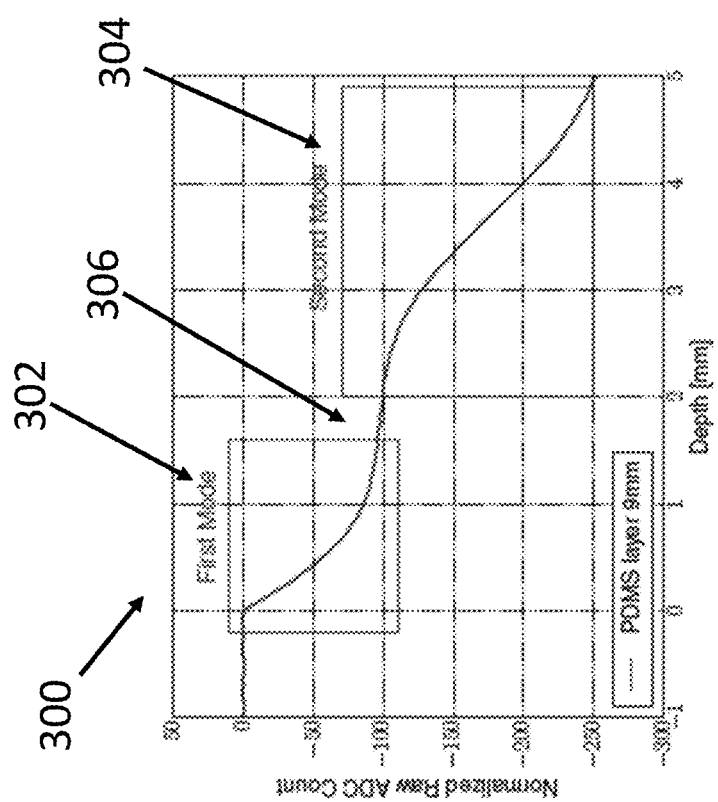

An experimental method for determining the height of the transparent elastomer to provide a sensor with contiguous modes is illustrated in FIGS. 3A-3B. Different prototype sensors were constructed that included 3D printed molds, e.g., black ABS material, and LEDs, e.g., SunLED model XSCWD23 MB, were placed 20 mm away from the photodiodes, e.g., Osram SFH 206K, on opposing sides of a square mold. The sensors had three LEDs on one side of the mold and three corresponding photodiodes were placed opposite of the LEDs. The mold was filled with a transparent elastomer, e.g., PDMS, Sylgard 184, from Dow Corning. PDMS and air have approximate refractive indexes of 1.4 and 1.0, respectively, which results in a critical angle of 45 degrees. This means that if light hits the boundary between PDMS and air at an angle greater than 45 degrees with respect to the surface normal, the ray is reflected back into the PDMS where it can be detected by the photodiode.

Testing prototypes with PDMS layers over 9 mm showed the presence of a deadband in indentation depth. After a certain threshold depth the photodiode signal does not change or changes minimally with additional indentation, until the indentation is deep enough to activate the second mode. FIG. 3A shows a graph 300 of the normalized raw ADC count, corresponding to the light detected at the photodiodes, for different probe depth values for a sensor with a PDMS layer of 9 mm. The graph is annotated to identify the two operating modes: the first mode 302, corresponding to indentation depth up to about 1.5 mm, and the second mode 304 corresponding to indentation depth over 2 mm. Between the first mode and the second mode FIG. 3A shows the deadband 306, where the received signal at the photodiodes does not change or changes minimally as the indentation depth increases from about 1.5 mm to 2 mm.

To identify when the two modes become continuous, e.g., there is no deadband, a set of sensors were built and tested with varying thickness of the transparent PDMS layer and the test results are illustrated in graph 350. The normalized raw ADC count measurements show that while the 7 mm layer provides the best continuity between the two modes, the 8 mm layer gives good continuity while also producing a slightly stronger signal when indented. Additionally, the 8 mm layer results in having the LEDs completely below the surface of the PDMS such that more light is guided through the PDMS layer. The sensors discussed below have a PDMS layer thickness of 8 mm.

Figure 4:
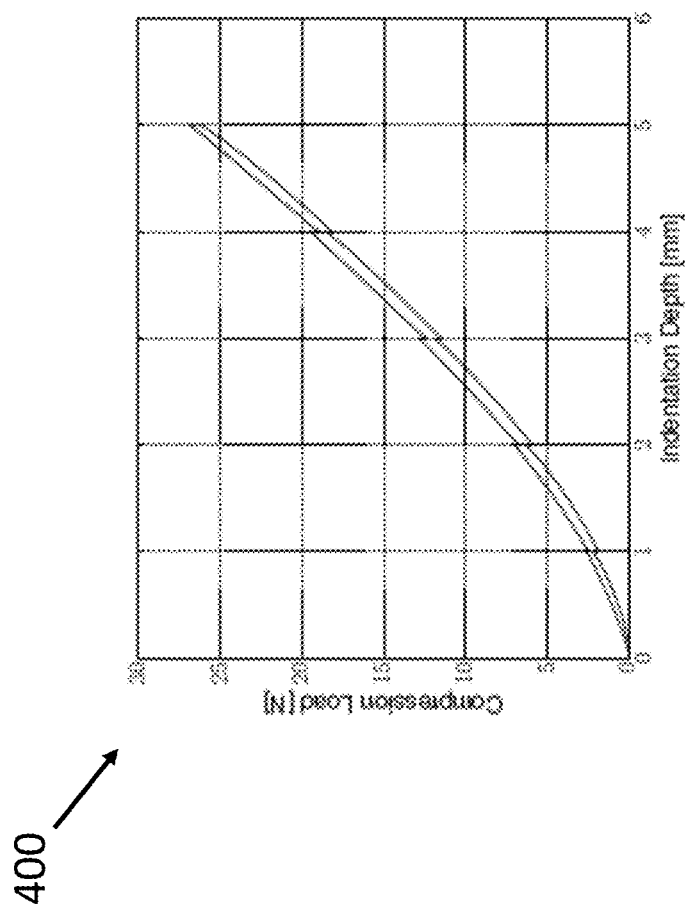
FIG. 4 illustrates an exemplary graph of the compression load for different indentations depth values, according to aspects of the disclosure.

Another parameter of choice for the sensor is the stiffness of the PDMS. This parameter allows direct manipulation of the mapping between the indentation depth and the indentation force. The stiffness of PDMS is determined by the weight ratio between the curing agent and the polymer itself. The PDMS stiffness of the exemplary sensors in FIGS. 3A and 3B corresponds to a ratio of 1:20 curing agent to PDMS. The disclosed sensors do not measure force directly, however, indentation depth can be used as a proxy for indentation force. FIG. 4 shows the mapping 400 between indentation depth up to 5 mm and force (compression load) for a 6 mm hemispherical tip used in the experiments. The measurements were taken by advancing (top line) or retracting (bottom line) the probe in 1 mm steps separated by 10 secs pauses.

While sensitivity to a large range of indentation depths (and forces) is desirable for applications in manipulation, it is not sufficient. The ability to localize the contact accurately on a two-dimensional surface embedded in a three-dimensional space, for example, a sensor mounted on a fingertip, is also desirable. According to aspects of the disclosure, the disclosed systems and methods can accurately localize an indentation, by constructing the sensors as tactile pads with numerous light emitters and receivers mounted around the perimeter of the sensors, as illustrated in FIG. 5. This can result in numerous emitter-receiver pairs, each behaving as a unit, like the one described in connection with FIGS. 2A-2C. Specifically, FIG. 5 shows an exemplary sensor 500 that enables several receivers (504) to be excited by a single emitter (502). The one-to-many relationship can generate a rich set of signals when switching through all the emitters in the sensor and collecting the signal information for each pair. Specifically, this multi-pair approach can generate a signal set with cardinality equal to the number of emitters multiplied by the number of receivers. According to aspects of the disclosure, an indentation anywhere in the sample can affect multiple signals between different emitter-receiver pairs. A data-driven approach can be used to directly learn how these signals map to variables of interest, for example, indentation location and indentation depth.

The sensor 500 of FIG. 5 comprises eight light emitting diodes (502) and eight photodiodes (504) arranged in an alternating pattern along the mold edge. The exemplary sensor 500 can be built using a three-dimensional printed square mold with exterior dimensions of 45 mm×45 mm. The cavity in the mold is 32 mm×32 mm, which represents the active sensing area. The LEDs and photodiodes can be mounted in sockets on the walls of this cavity, which can be filled with PDMS, after the LEDs and photodiodes have been mounted in the sockets. As shown in FIG. 5, light can travel from emitters to receivers via multiple paths that cover the sensing area. This way any LED can excite several photodiodes.

According to aspects of the disclosure, the sensing area can by swept to determine the location and depth of the indentation, for example, by reading the signals from all the photodiodes as different LEDs turn on. The sensor 500 of FIG. 5 has eight LEDs, and therefore, can produce eight signals for each photodiode when each LED turns on, and an additional signal with all LEDs turned off. The signals received at the photodiodes when the LEDs are off corresponds to measurement of the ambient light captured by each photodiode, which results to a total of nine signals per photodiode. According to aspects of the disclosure, the information received from the photodiodes from ambient light, can be considered every time the sensor is exposed to ambient light such that the sensor can perform consistently in different lighting situations. This can be achieved for example, by using the information received at the photodiodes when all LEDs are turned off as a baseline that can be removed from every other state at each sampling time.

To test a sensor, a microcontroller board, e.g., an Arduino Mega 2560, can switch the sensor between the nine states (eight states where only one of the eight LEDs are turned on and a ninth state where none of the LEDs are turned on), and can take analogue readings of each photodiode. The photodiode signal can be amplified through a standard transimpedance amplifier circuit, and each LED can be driven at full power using an NPN bipolar junction transistor. Selecting an appropriate frequency, e.g., 60 Hz, can allow the microcontroller to send one message containing the values of all photodiodes for each of the 9 states.

The test setup for data collection can include a planar stage (Marzhauser LStep) and a linear probe located above the stage to indent vertically on the sensor. A 6 mm hemispherical tip can be used on the linear probe. The linear probe can be position-controlled and the reference level can be set manually to be the position where the indenter tip makes contact with the sensor surface. According to aspects of the disclosure, if the linear probe does not have force-sensing capabilities, the indentation depth can be used as a proxy for indentation force.

According to aspects of the disclosure, different patterns can be used for indenting the sample to generate the signal set that can contain information for identifying the location and depth of an indentation with high accuracy. For example, according to a grid indentation pattern, the sensor is indented based on a 2 mm regular grid. Considering the sensor of FIG. 5 and taking into account the diameter of the tip and a margin, e.g., 3 mm, such that there is no indenting directly next to an edge, a grid indentation pattern can result in 121 indent locations distributed over a 20 mm×20 mm area. As another example, according to a random indentation pattern, the sensor is indented at randomly generated locations within.

According to aspects of the disclosure, at each location of indentation the same protocol is followed. The sensor surface can be considered as the reference level, and positive depth values correspond to the indenter tip going deeper into the sensor. The disclosed methods can discriminate touch vs. non-touch conditions, and for this purpose data at both negative and positive depths are collected. For depths between −10 mm and −1 mm, one data point can be collected every 1 mm. The indenter then goes down to a depth of 5.0 mm taking measurements every 0.1 mm. The same procedure is mirrored with the indenter tip retracting. A person of ordinary skill would understand that these values are exemplary and that different depths and steps can be applied. The same procedure can be mirrored with the indenter tip retracting.

Each measurement i results in a tuple of the form $\Phi_i=(x_i, y_i, d_i, p_j^1=1, \ldots, p_j^B=1, \ldots, p_j^1=9, \ldots, p_j^8=9)$ where $(x_i,y_i)$ is the indentation location in sensor coordinates, $d_i$ is the depth at which the measurement was taken, and $(p_j^1, \ldots p_j^8)$ corresponds to the readings of the 8 photodiodes at state $j\in[1, 9]$. For each diode, states 1 through 8 correspond to each one of the 8 LEDs being ON, and state 9 corresponds to the case where all the LEDs are OFF. Thus each tuple $\Phi_i$ can comprise a total of seventy two numbers.

According to aspects of the disclosure, the tuples are analyzed to generate mappings between the photodiode readings $(p_j^1, \ldots p_j^8)$ and the indentation location and depth $(x_i, y_i, d_i)$. According to aspects of the disclosure, identifying the mapping can be achieved in two steps. First, a classifier, e.g., a liner Support Vector Machine (SVM), can determine if a touch is occurring. This classifier can be trained on data points with negative and positive depth valies, e.g., $d_i<0$ and $d_i\geq 0$. Second, if the classifier predicts that touch is occurring, a second stage regressor can be used to generate continuous predicted values for $(x_i,y_i,d_i)$. This regressor can be trained only on training data with $d_i\geq 0$. A kernelized ridge regressor can be used with a Laplacian kernel. The regressor can use part of the training data, e.g., half of the training data, to calibrate the ridge regression tuning factor λ and the kernel bandwidth γ through grid search. The results presented herein were obtained with λ=2.15e−4 and γ=5.45e−4.

To train the predictors, four grid pattern datasets were collected, each consisting of 121 indentations, and each indentation containing 161 data points at different depths. Two of these datasets were collected with the sensor exposed to ambient light and the other two datasets were collected in darkness. As discussed above, during the first step, the classifier can receive both the contact and non-contact data points, and during the second step, the regressor can be trained on the contact data points. The feature space used for training has a dimensionality of 64, since the state where all LEDs are turned off is first subtracted from all other signals and not used as a stand-alone feature.

According to aspects of the disclosure, a metric for quantifying the success of the regressor prediction can be the magnitude of the error for both the localization and depth accuracy. In case of the classifier, a metric for quantifying the success can be the percentage of successful predictions. For the particular test dataset is collected on a random indentation pattern, which contains 100 indentation events. The results described herein are obtained by testing the models against two different test datasets: one collected in ambient light and another collected in the dark.

Classification results in the region of interest for the touch vs. no-touch case are summarized in Table 1. These results are sliced at a certain depth, and they aggregate the classification performance across all 121 locations. With both test datasets, the classifier has difficulty detecting touch at 0 mm, where the tip of the indenter is barely making contact with the sensor. However, at 0.6 mm depth the dark test dataset already provides a 90% success rate in the classification, while the ambient light test dataset provides 76% success rate. According to the mapping presented on FIG. 4, a depth of 0.6 mm corresponds to an indentation force of approximately 2 Newtons. This represents the minimum force at which the sensor can detect the indenter tip making contact.

TABLE 1

Touch v. no touch classification success rate

| Ground Truth | Depth Value | Ambient Light test set | Dark test set |
| --- | --- | --- | --- |
| No touch | −0.4 mm | 1.0 | 1.0 |
| No touch | −0.2 mm | 0.99 | 1.0 |
| Touch | 0 mm | 0.04 | 0.10 |
| Touch | 0.2 mm | 0.32 | 0.33 |
| Touch | 0.4 mm | 0.51 | 0.65 |
| Touch | 0.6 mm | 0.76 | 0.90 |
| Touch | 0.8 mm | 0.96 | 0.96 |
| Touch | 1.0 mm | 0.98 | 0.98 |

Figure 6C:
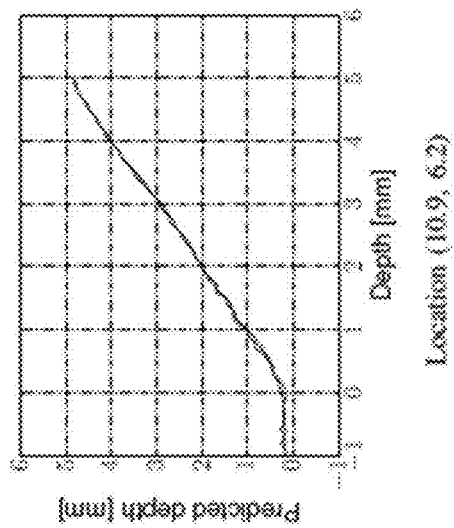
FIGS. 6A-6C illustrate exemplary graphs of regression results for depth prediction at different locations on a tactile sensor, according to aspects of the disclosure.
Figure 6B:
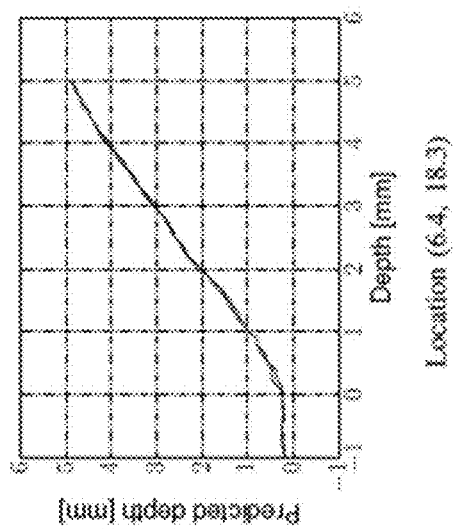
Figure 6A:
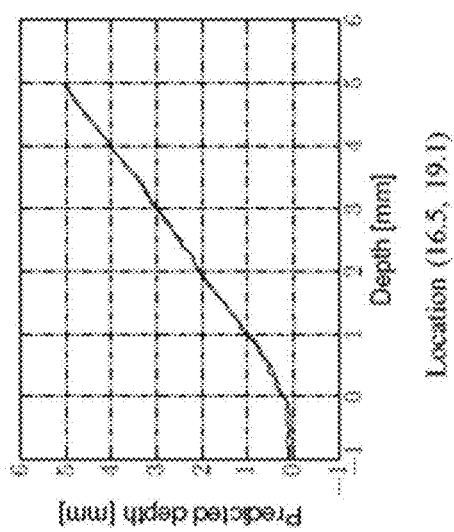

The regression for depth can only be visualized for a specific location in the test dataset. FIGS. 6A-6C show the performance, e.g., predicted depth v. actual depth, at three different random locations in the ambient light test dataset. Specifically, the figures how the regression results for depth prediction at a relatively central location (FIG. 6A), an edge location close to the x-axis (FIG. 6B), and another edge location close to the y-axis of the sample (FIG. 6C). The regressor is trained only on contact data, therefore, it cannot predict negative depths, which causes the error to be greater at depths close to 0 mm. At depths of 0.5 mm and deeper, the depth prediction shows an accuracy of below half a millimeter.

FIGS. 7A-7F show regression results for localization on the ambient light dataset for a few representative depths. Each arrow represents one indentation in the test set; the base is at the ground truth location while the tip of the arrow shows the predicted location. Specifically, FIGS. 7A-7F show results corresponding to indentation depths of 0.1 mm, 0.5 mm, 1.0 mm, 2.0 mm, 3.0 mm, and 5.0 mm, respectively. At depth 0.1 mm (FIG. 7A) the signals are adequate to provide accurate localization, but with additional indentation, e.g., 0.5 mm and deeper, localization improves well beyond sub-millimeter accuracy. Accuracy in localization and depth for both the ambient light and dark test datasets is presented in more detail in Tables 2 and 3. These tables report the mean error, median error and standard deviation of both localization and depth predictions over the complete testing datasets.

TABLE 2

Localization and depth accuracy for ambient light dataset

| | Localization Accuracy | | | Depth Accuracy | | |
|---|---|---|---|---|---|---|
| Depth | Median Err. | Mean Err. | Std. Dev | Median Err. | Mean Err. | Std. Dev |
| 0.1 mm | 2.189 | 2.369 | 1.508 | 0.167 | 0.167 | 0.079 |
| 0.5 mm | 0.717 | 0.838 | 0.616 | 0.050 | 0.060 | 0.048 |
| 1.0 mm | 0.641 | 0.744 | 0.530 | 0.048 | 0.065 | 0.051 |
| 2.0 mm | 0.421 | 0.500 | 0.316 | 0.040 | 0.048 | 0.037 |
| 3.0 mm | 0.362 | 0.413 | 0.256 | 0.037 | 0.047 | 0.041 |
| 5.0 mm | 0.314 | 0.359 | 0.222 | 0.081 | 0.092 | 0.062 |

TABLE 3

Localization and depth accuracy for dark dataset

| | Localization Accuracy | | | Depth Accuracy | | |
|---|---|---|---|---|---|---|
| Depth | Median Err. | Mean Err. | Std. Dev | Median Err. | Mean Err. | Std. Dev |
| 0.1 mm | 3.502 | 3.832 | 2.202 | 0.182 | 0.183 | 0.072 |
| 0.5 mm | 1.102 | 1.333 | 0.985 | 0.050 | 0.058 | 0.044 |
| 1.0 mm | 0.779 | 0.840 | 0.535 | 0.056 | 0.064 | 0.047 |
| 2.0 mm | 0.547 | 0.657 | 0.452 | 0.047 | 0.056 | 0.046 |
| 3.0 mm | 0.410 | 0.487 | 0.322 | 0.039 | 0.050 | 0.042 |
| 5.0 mm | 0.316 | 0.392 | 0.288 | 0.089 | 0.109 | 0.072 |

Figure 8:
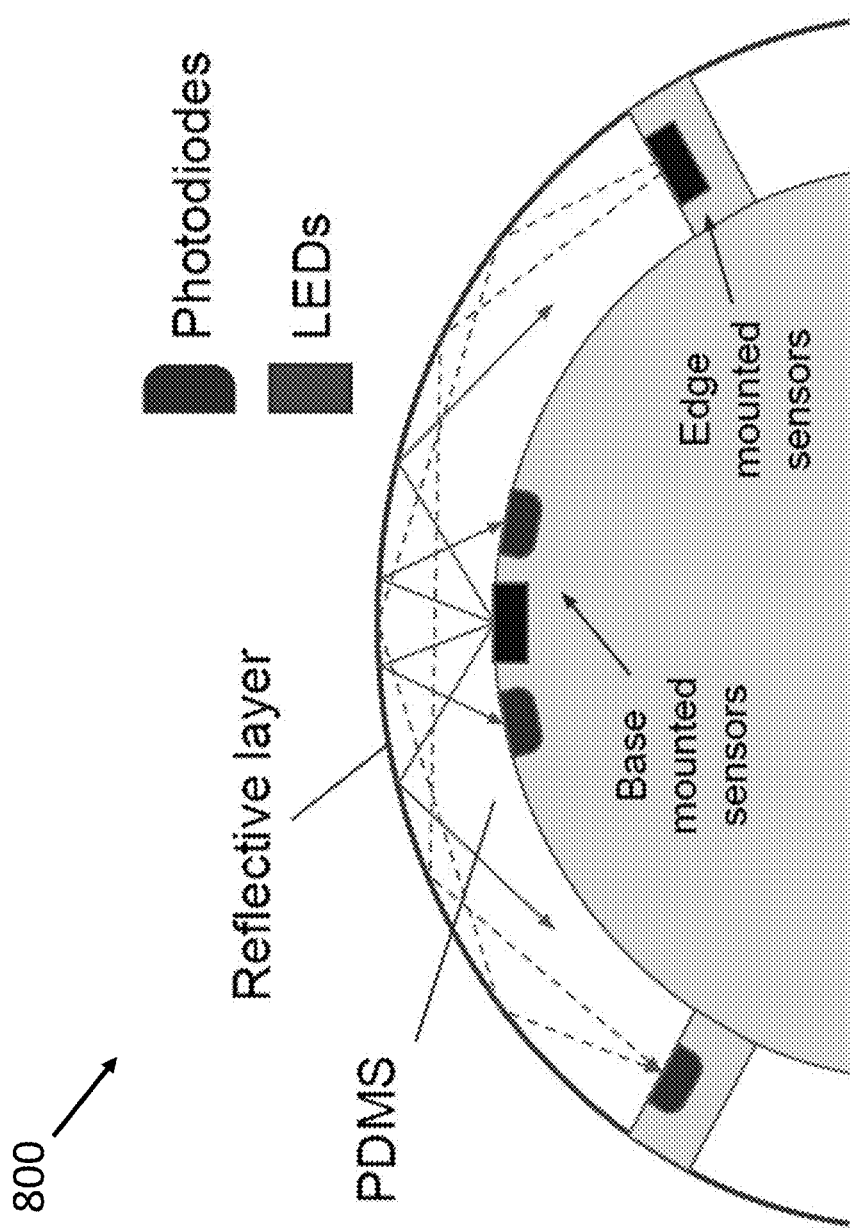
FIG. 8 illustrates an exemplary tactile sensor design, according to aspects of the disclosure.

According to aspects of the disclosure, the disclosed sensors can be generalized for arbitrary geometries, such that any surface can be covered. For example, FIG. 8 shows an exemplary sensor 800, where LEDs and photodiodes are distributed on the base and edges of the holding structure. FIG. 8 shows a transparent PDMS casted over the curved surface and a reflective layer deposited on top. FIG. 8 also shows light from the LEDs guided through the PDMS to the photodiodes. Similar to the examples of FIGS. 2A-2C and 5, contact with the sensor, e.g., the reflective layer, will result in a deformation of the reflective layer, changing the direction of reflected light rays, which in turn results in a measurable signal change in several photodiodes of the sensor. Using data driven techniques, as explained above, the disclosed systems and methods can determine touch parameters like location and force (or depth).

According to aspects of the disclosure, multi-touch capability can be incorporated into the detection algorithms. Increasing the number of sensing units or even incorporating different sensors embedded into the elastomer can extend the sensing modalities in the sensor. Different learning methods like deep neural networks can also improve the performance and/or capability of the sensor. The exemplary sensors presented herein can achieve sub-millimeter accuracy over a 400 mm$^2$ workspace, while also reporting indentation depth within 0.5 mm throughout most of the operating range.

According to aspects of the disclosure, strain sensors can be used be used for robotic skin applications. Strain sensors measure the deformation of a layer. This class of sensors includes piezoelectric materials, such as polyvinylidene fluoride (PVDF), and resistive sensors made from elastic metals or conductive thin films, such as gold or poly(3,4-ethylenedioxythiophene) (PEDOT). Strain sensors do not natively measure pressure, which is required for grip, contact, and other sensor skin applications.

According to aspects of the disclosure, a flexible, low-durometer layer is provided that can be placed beneath a strain sensor, and can convert the strain sensor to a pressure sensor, allowing its use in pressure sensitive applications. This can, for example, include the placement of the sensing enhancement layer beneath a strain sensor layer, and above a stiff structure such as a robot skin or metal strut. The flexible layer can be co-integrated using a laminating layer, temperature, and pressure or can be directly cured on the sensor layer. The purpose of the flexible layer is to allow for the sensor layer to mechanically deform and convert mechanical movement to change in charge or voltage.

The flexible low-durometer material can be PDMS. PDMS has a low Young's modulus, which allows for large elastic deformation relative to the applied pressure. Different values of layer thickness can allow different responsivity of the piezoelectric sensor. According to aspects of the disclosure, the thicknesses of the layer can range from 0 to 450 microns. The disclosed sensors can be used on a robot's surface. In addition, the flexible layer can allow commercial development of the outer robotic "skin." Together with the sensor layer, the flexible layer can allow robust designs of responsive and precise sensors.

Figure 9:
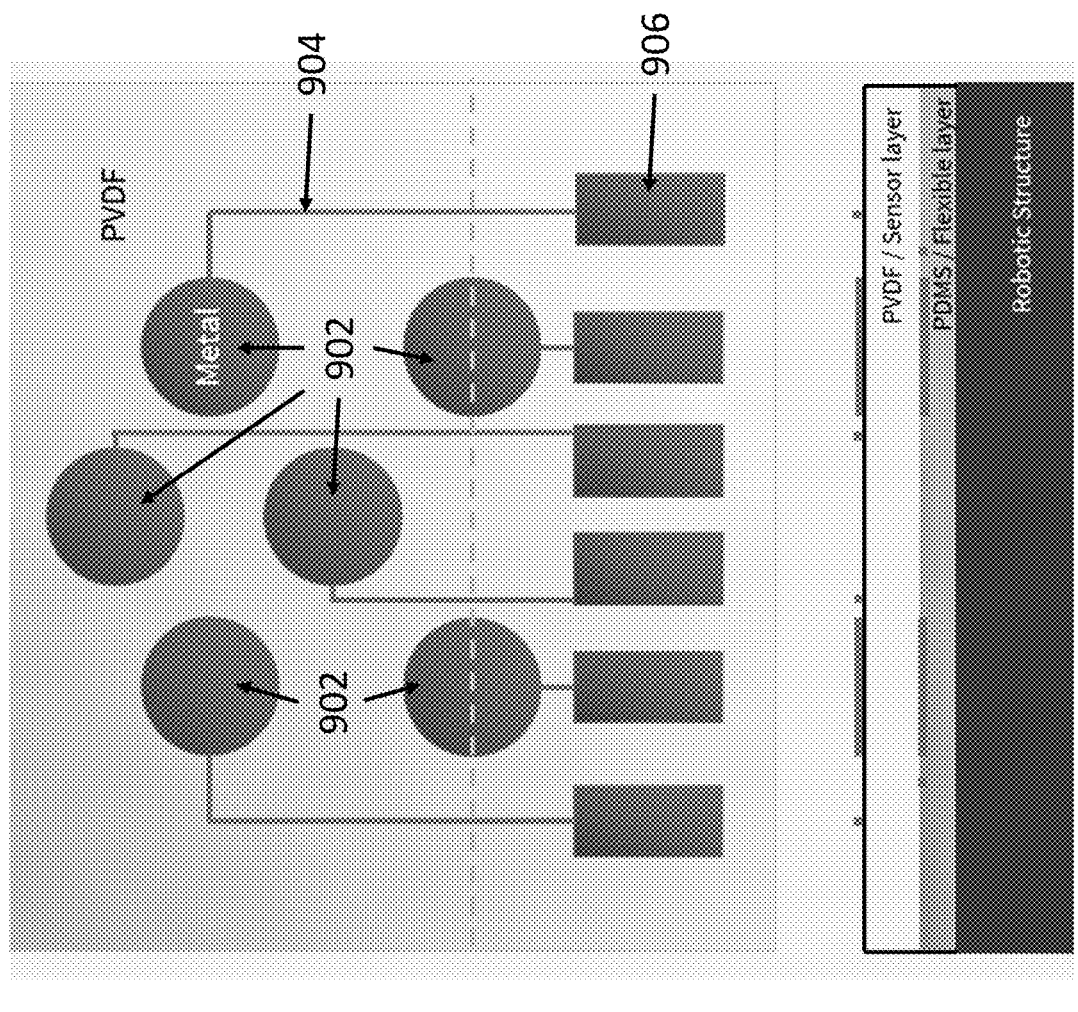
FIG. 9 illustrates an exemplary tactile sensor design, according to aspects of the disclosure.

FIG. 9 shows an exemplary structure 900 according to aspects of the disclosure. A compliant layer, e.g., PDMS, can be placed beneath a tactile sensor, e.g., PVDF, and above a robotic surface. The compliant layer allows the tactile sensor to bend and compress and can serve as a flexible buffer so the tactile sensor will be responsive. The compliant layer also provides insulation between the conductive material on the sensor and the metallic robotic structure.

According to aspects of the disclosure, the material properties of compliant layer that allow it to bend and/or deform include Low Young's modulus (360-3000 kPa) and tensile strength of 2.24 MPa.

PVDF is a piezoelectric material, such that when it deforms it can generate charge. In order to measure that charge, metal electrodes can be placed on the top and bottom of the material to create a capacitor-like structure, as shown in FIG. 9. The charge can be measured using an operational amplifier circuit so that changes in the charge of the PVDF layer can lead to changes of the voltage output of the circuit. The metal electrodes 902 are connected by traces (thin metal lines) 904 to pads 906 of the same metal so that it is easier to contact with external wires. The metal design can change depending on what is being measured. To measure movement at different locations on the robotic structure six metal electrodes can be used, as shown in FIG. 9. They serve the same purpose but at different locations on the fingertip.

In order to avoid cross talk and measuring undesired charge, the traces are staggered so they do not form a capacitor structure. In the design of FIG. 9, there are four traces on the top metal layer and two traces on the bottom metal layer. A similar process can be used to measure strain. Metal can be placed on a flexible material. Then applied force causes the metal to deform, which in turn changes the electrical properties, e.g., resistance, of the metal.

Figure 10:
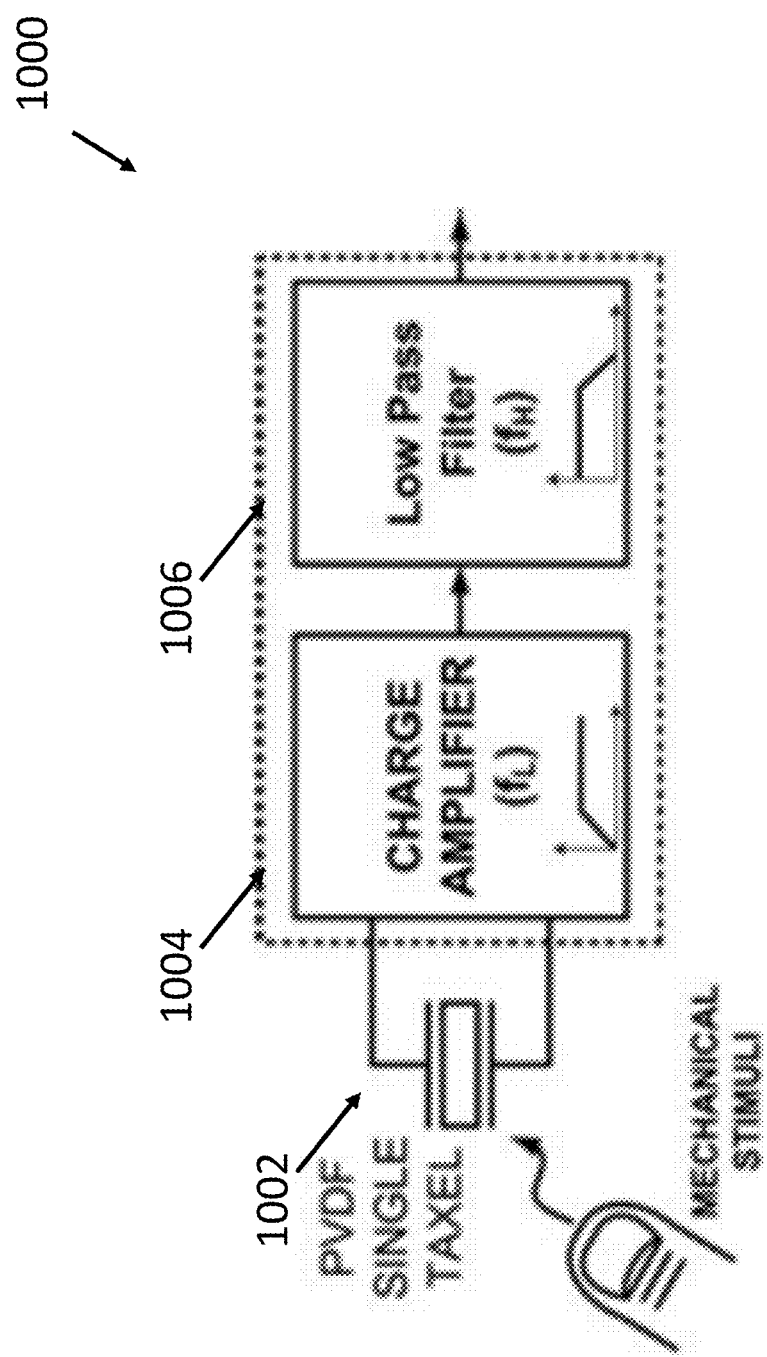
FIG. 10 illustrates an exemplary block diagram of a system, according to aspects of the disclosure.

FIG. 10 shows an exemplary block diagram 1000 of a system according to aspects of the disclosure. A PVDF single taxel 1002 is coupled to a charge amplifier 1004. Mechanical stimuli, e.g., finger pressure, can be detected in the taxel. The signal can be amplified through the charge amplifier 1004, e.g., a high-pass filter, and then processed through a low pass filter 1006.

Figure 11:
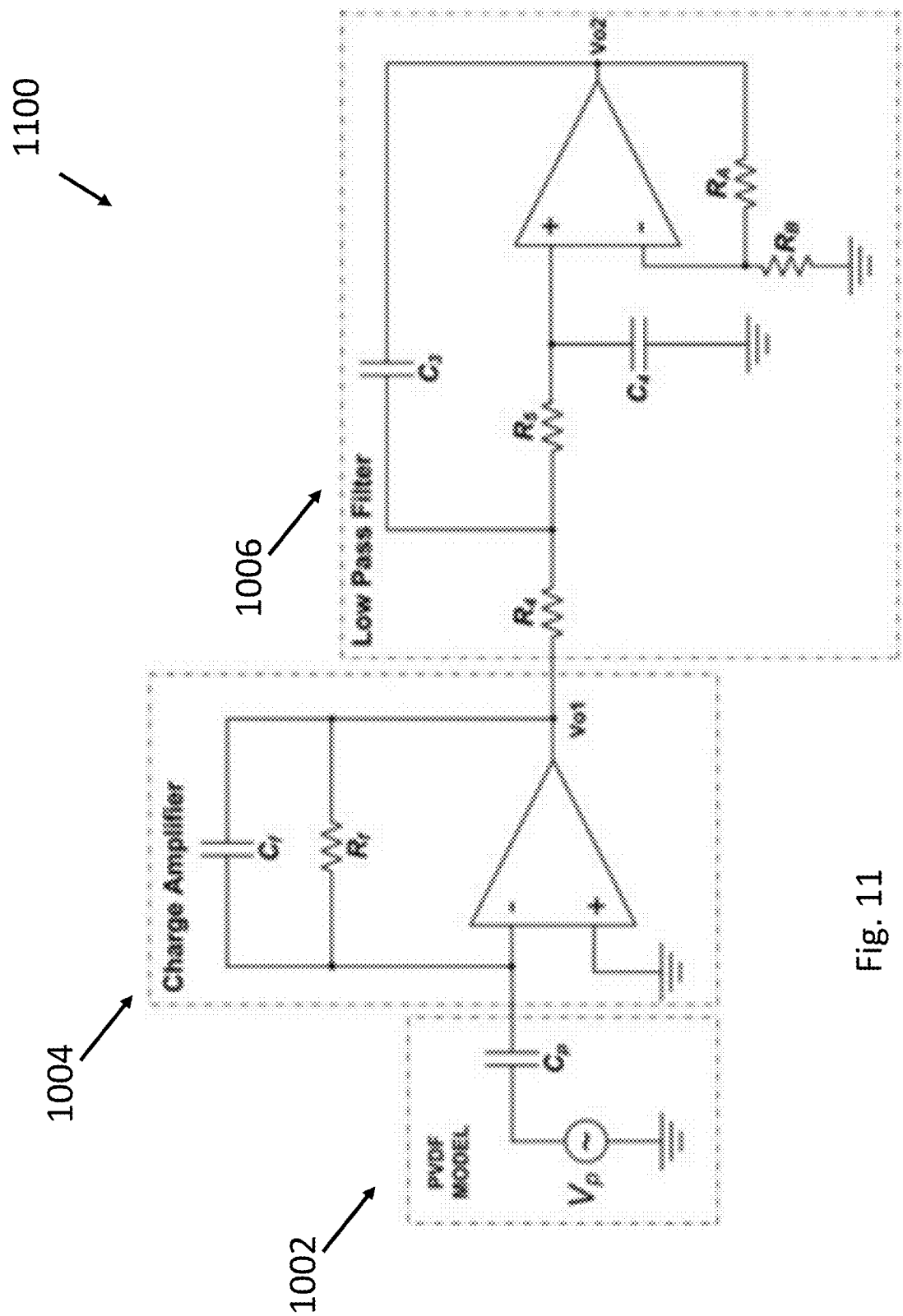
FIG. 11 illustrates an exemplary equivalent electrical circuit of a PVDF single taxel, according to aspects of the disclosure.

FIG. 11 shows an exemplary equivalent electrical circuit of a PVDF single taxel 1002 as shown in FIG. 10, according to aspects of the disclosure. FIG. 11 also shows exemplary implementations of charge amplifier 1004 and low pass filter 1006.

Testing data shows that different types of compliant layers (e.g., PDMS or foam) affect the sensitivity of the PVDF sensors. Table 4 shows testing results of a PVDF sensor with different types of foams, which show the difference in responsivity of the piezoelectric response, e.g., the physical displacement of the material leads to change in charge/voltage across the material.

TABLE 4

Testing results of a PVDF sensor

| Foam | Compliant Layers | Cell Type | Thickness (mm) | Pressure to Compress 25% (psi) |
|---|---|---|---|---|
| 1 | Polyurethane Foam | Open | 0.734 | 45 |
| 2 | Silicone Foam | Closed | 0.810 | 10 |
| 3 | Neoprene/EPDM/SBR | Closed | 1.59 | 7 |
| 4 | Silicone Foam | Open | 1.59 | 3 |

Figure 12:
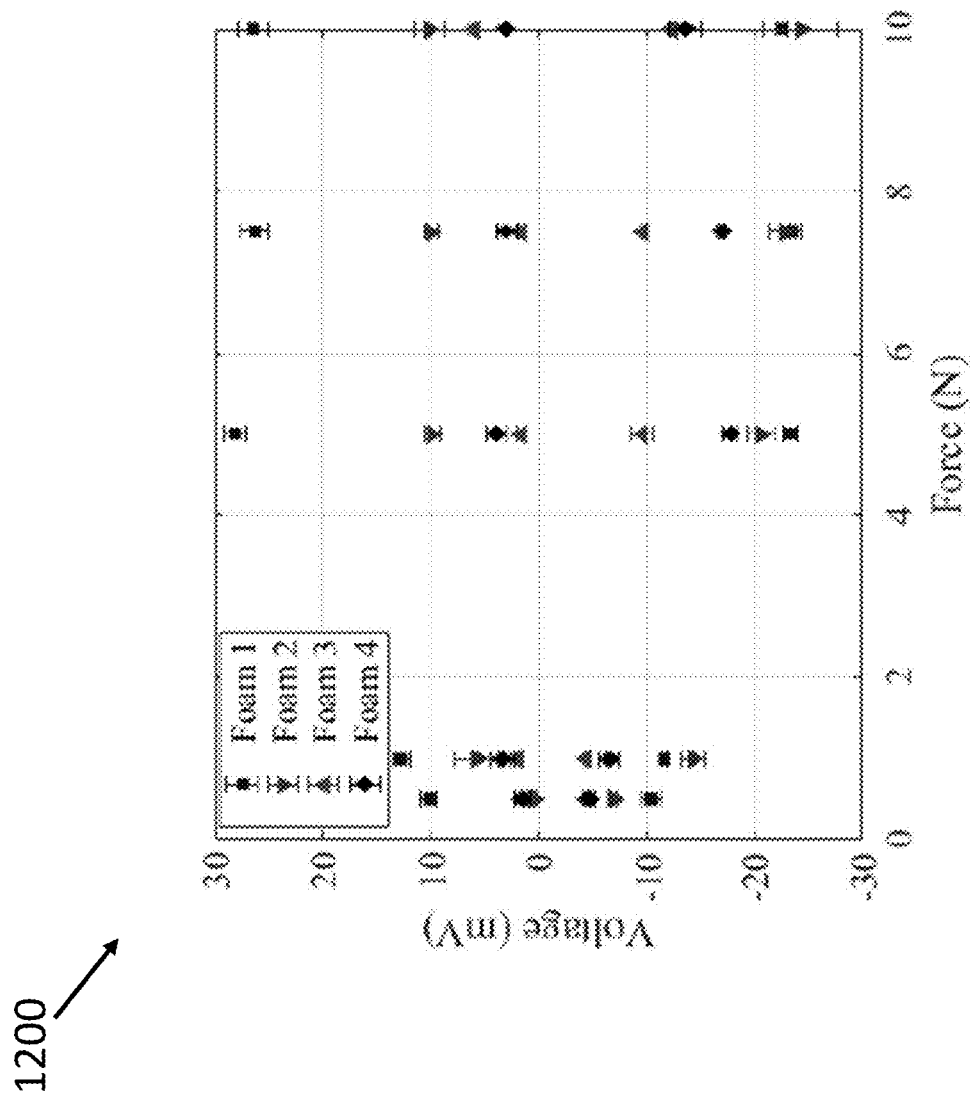
FIG. 12 illustrates a graph of the voltage output of an exemplary sensor, according to aspects of the disclosure.

The testing results are also illustrated in FIG. 12, which shows a graph 1200 of the measured voltage values with varying for the 4 different foams and different intensity of the mechanical stimuli, e.g., applied force.

The testing results indicate that an open cell foam that is thin, e.g., thickness of less than a millimeter, resulted in the largest increase in the sensitivity of the sensors. For example, foam 1 increased the sensitivity of the sensor by over 4 times than foam 3 and foam 4. This foam also requires more pressure to compress, which means it will most likely be durable for many robotic grasps. Foams with thickness of about a millimeter, can result in sensors of approximate thickness of 1.1 mm. This thickness will not cause robotic fingers and hands to lose dexterity. All the tested materials can be easily bent around robotic edges. Therefore, the disclosed systems and methods can receive information from the edges and sides of robotic fingers, where prior art sensors are not typically placed. According to aspects of the disclosure, some foams have adhesives attached to one side, which means that the sensor layer stack can adhere with the compliant layer onto any structure.

Figure 13:
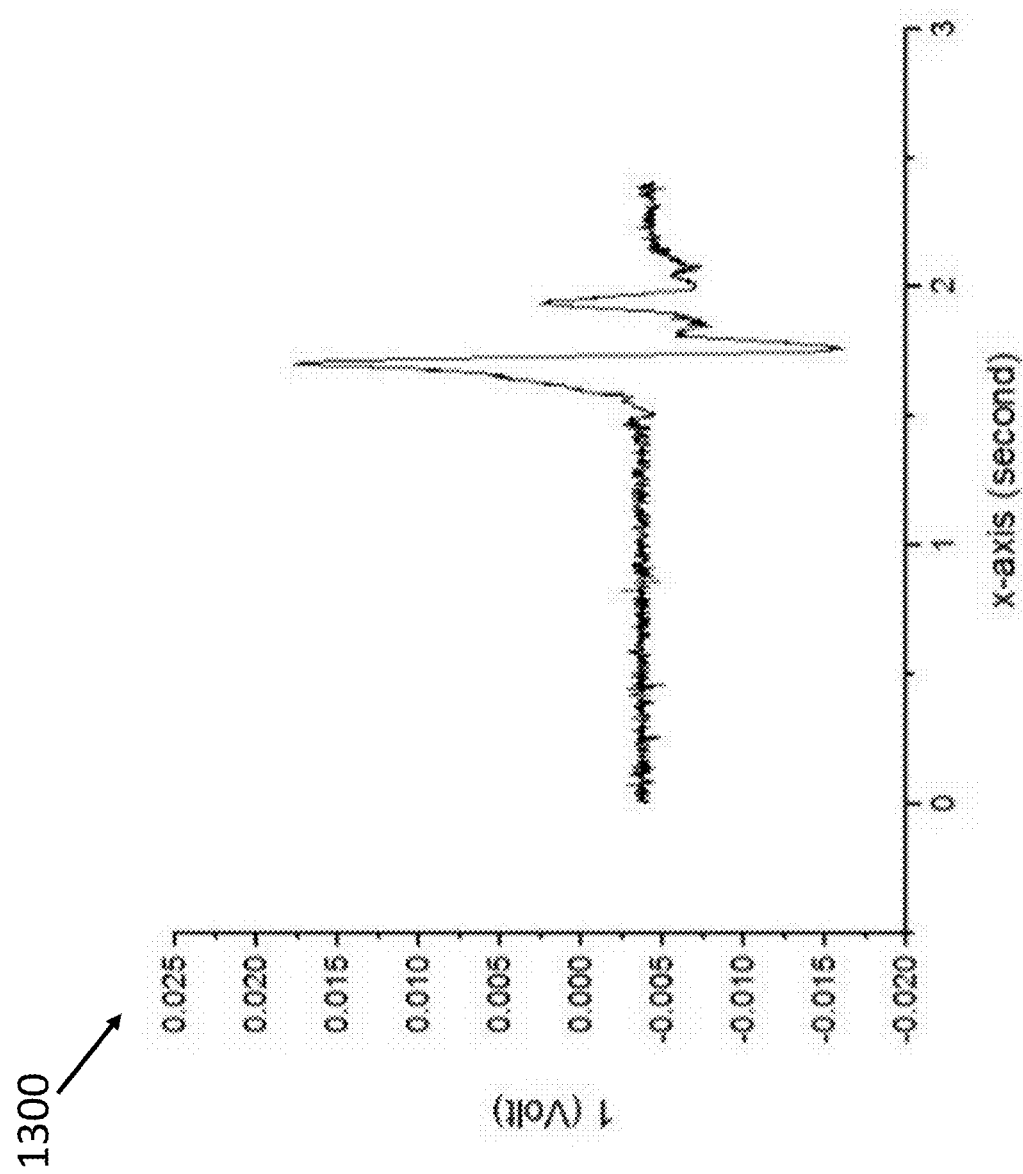
FIG. 13 illustrates a graph of the characteristic voltage response with a large positive and negative peak that correspond to the material being displaced in opposite directions when a certain amount of force is applied, according to aspects of the disclosure.

FIG. 13 shows the characteristic voltage response 1300 with a large positive and negative peak that correspond to the material being displaced in opposite directions when a certain amount of force is applied. The characteristic voltage output of the PVDF sensors demonstrates that the sensitivity of PVDF sensors can be increased by adding the compliant layer of foam without drastically changing the design and processing of the PVDF sensors.

Figure 14:
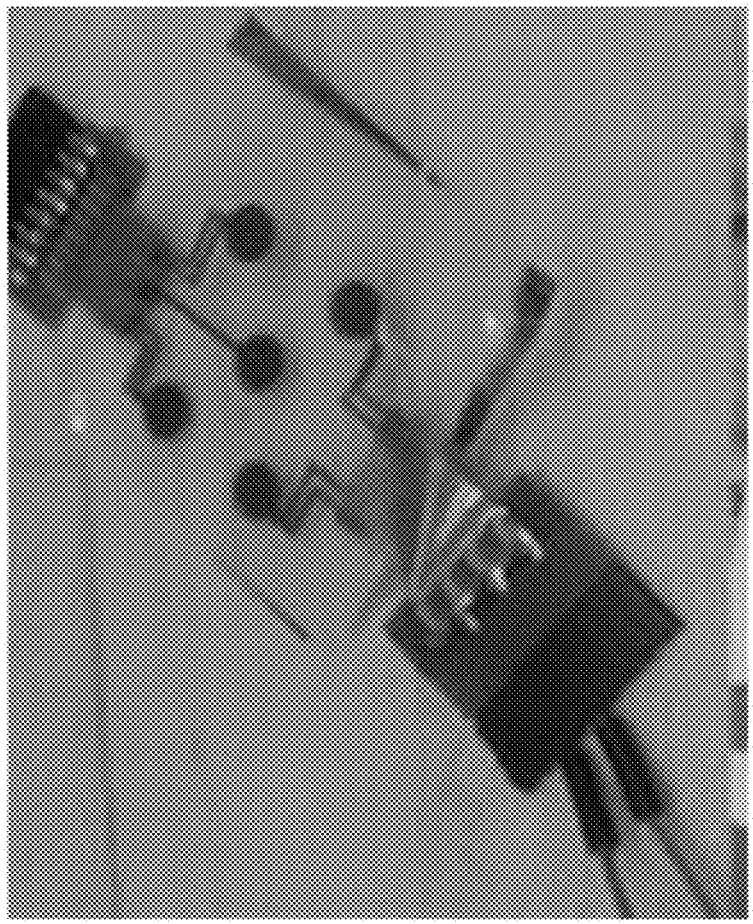
FIG. 14 illustrates a picture of an exemplary tactile sensor, according to aspects of the disclosure.

FIG. 14 shows a picture of a piezoelectric sensor, according to aspects of the disclosure. The sensor of FIG. 14 comprises 52 micron thick PVDF with metal electrodes on the top and bottom.

Figure 15:
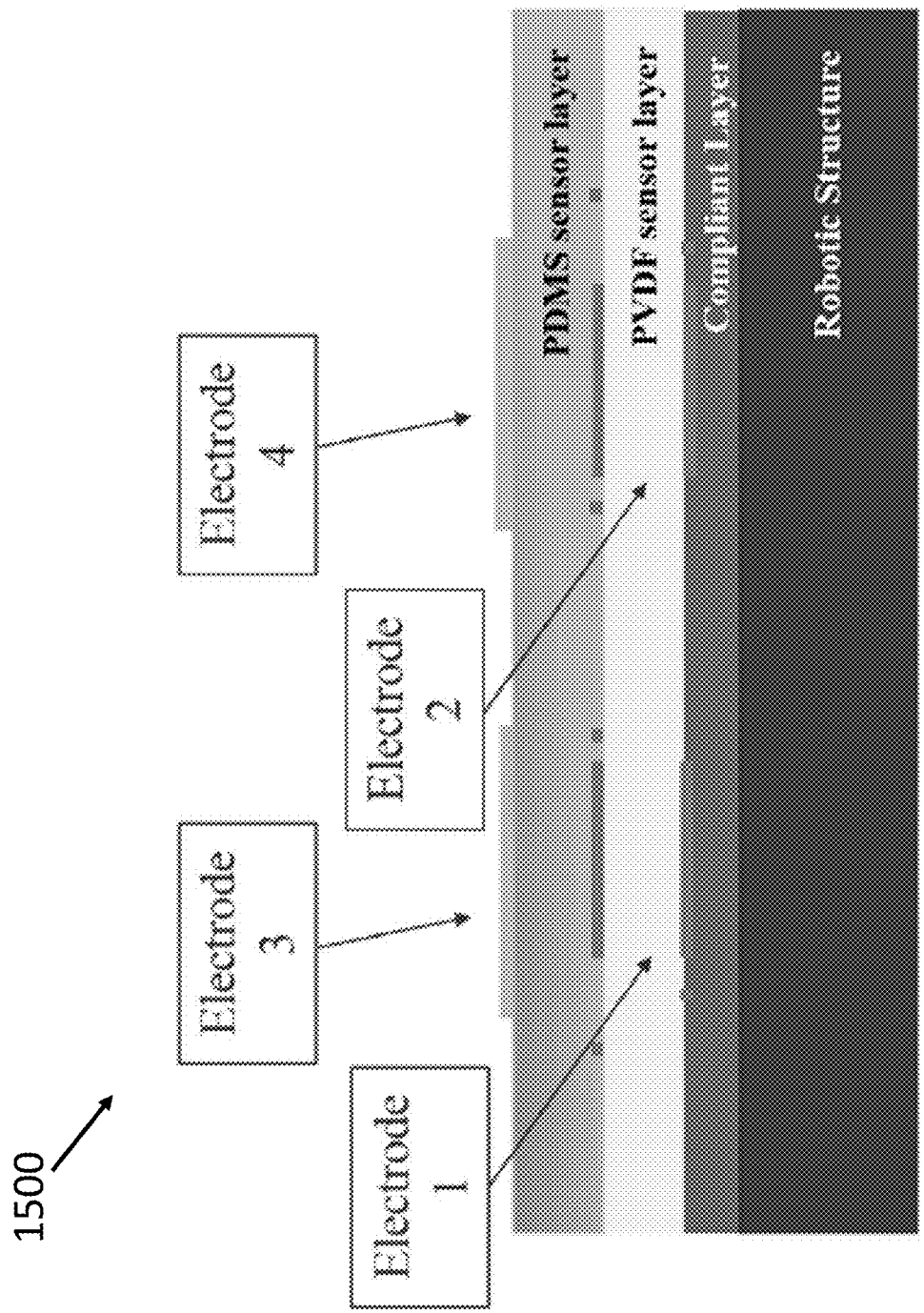
FIG. 15 illustrates an exemplary tactile sensor design, according to aspects of the disclosure.

FIG. 15 shows an exemplary sensor according to aspect of the disclosure. Specifically, the sensor of FIG. 15 shows a PDMS sensor layer, a PVDF sensor layer, a compliant layer, and a robotic structure in a stacked arrangement. FIG. 15 also shows electrode 1 and 2 between the PVDF sensor layer and the compliant layer and electrodes 3 and 4 over the PDMS sensor layer.

Figures 16A, 16B:
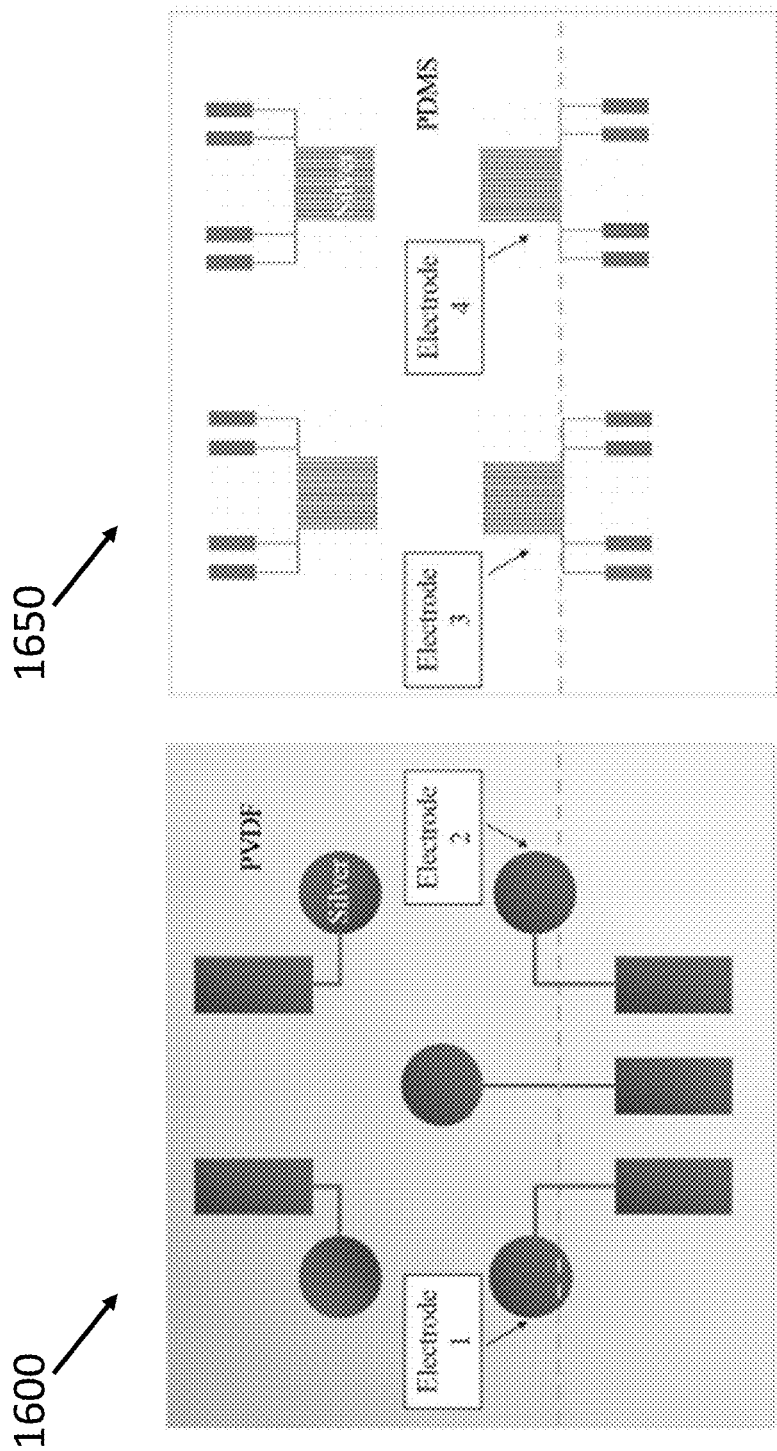
FIGS. 16A-16B illustrate top views of the exemplary tactile sensor of FIG. 15, according to aspects of the disclosure.

FIGS. 16A-16B show two top views of the sensor of FIG. 15. Specifically, FIG. 16A shows a top view 1600 of the PVFD layer showing Electrodes 1 and 2, while FIG. 16B shows a top view 1650 of the PDMS layer showing Electrodes 3 and 4.

The invention claimed is:

1. A sensor comprising:
a volume of transparent material;
one or more light emitting diodes configured to emit light into the transparent material;
one or more photodetectors configured to receive emitted light from the one or more light emitting diodes;
a frame defining a sensing area filled with the volume of transparent material, and wherein the one or more light emitting diodes and the one or more photodetectors are mounted on the frame around the sensing area; and
a light absorbing surface between a first surface of the volume of transparent material and a first surface of the frame;
wherein the sensor is configured to detect a change in the received light at the one or more photodetectors in response to an indentation at a surface of the volume of transparent material.

2. The sensor of claim 1, wherein the sensor is further configured to estimate a location of the indentation at the surface of the volume of transparent material based on the change in the received light at the one or more photodetectors.

3. The sensor of claim 1, wherein the sensor is further configured to estimate a depth of the indentation at the surface of the volume of transparent material based on the change in the received light at the one or more photodetectors.

4. The sensor of claim 1, wherein the volume of transparent material comprises polydimethylsiloxane (PDMS).

5. The sensor of claim 1, wherein the first surface of the frame is curved and wherein at least one light emitting diode is mounted on the first surface of the frame.

6. The sensor of claim 1, further comprising a light reflective surface where light from the one or more light emitting diodes is reflected back into the volume of transparent material, when the light from the one or more light emitting diodes hits the light reflective surface at a first angle.

7. The sensor of claim 6, wherein at least one photodetector is configured to receive first light from at least one light emitting diode through a direct path and to receive second light from the at least one light emitting diode thought an indirect path, where the second light has been reflected at the light reflective surface.

8. A sensor comprising:
a volume of transparent material;
one or more light emitting diodes configured to emit light into the transparent material; and
one or more photodetectors configured to receive emitted light from the one or more light emitting diodes;
wherein the sensor is configured to detect a change in the received light at the one or more photodetectors in response to an indentation at a surface of the volume of transparent material;
wherein the sensor is configured to operate at a first mode of detection when the depth of the indentation is smaller than a first threshold.

9. The sensor of claim 8, wherein the sensor is configured to operate at a second mode of detection when the depth of the indentation is larger than a second threshold.

10. The sensor of claim 8, wherein the sensor is further configured to estimate a location of the indentation at the surface of the volume of transparent material based on the change in the received light at the one or more photodetectors.

11. The sensor of claim 8, wherein the sensor is further configured to estimate a depth of the indentation at the surface of the volume of transparent material based on the change in the received light at the one or more photodetectors.

12. The sensor of claim 8, wherein the volume of transparent material comprises polydimethylsiloxane (PDMS).

13. The sensor of claim 8, further comprising a light reflective surface where light from the one or more light emitting diodes is reflected back into the volume of transparent material, when the light from the one or more light emitting diodes hits the light reflective surface at a first angle.

14. The sensor of claim 8, wherein at least one photodetector is configured to receive first light from at least one light emitting diode through a direct path and to receive second light from the at least one light emitting diode thought an indirect path, where the second light has been reflected at the light reflective surface.

* * * * *